United States Patent
Beier et al.

[19]

[11] Patent Number: 5,640,095
[45] Date of Patent: Jun. 17, 1997

[54] CIRCUIT ARRANGEMENT FOR LEAKAGE-RESISTANCE TESTING OF A CIRCUIT POINT

[75] Inventors: Ralf Beier; Axel Näthe, both of Hamburg; Marten Swart, Obertraubling; Horst Belau, Kelheim-Kopfelberg, all of Germany

[73] Assignees: U.S. Philips Corp., New York, N.Y.; Siemens AG, Munich, Germany

[21] Appl. No.: 491,202

[22] Filed: Jun. 16, 1995

[30] Foreign Application Priority Data

Jun. 24, 1994 [DE] Germany ............... 44 22 264.5

[51] Int. Cl.[6] .................................................. G01R 27/26
[52] U.S. Cl. ..................... 324/522; 324/713; 324/537
[58] Field of Search ........................... 324/522, 713, 324/718, 509, 537; 340/650

[56] References Cited

U.S. PATENT DOCUMENTS 5,121,482  6/1992  Patton .......................... 324/713
5,332,973  7/1994  Broun .......................... 324/537
5,392,293  2/1995  Hsue ........................... 324/158.1
5,402,072  3/1995  Chiang et al. ................. 324/537
5,481,194  1/1996  Schantz et al. ................ 324/713

FOREIGN PATENT DOCUMENTS 0486114  5/1992  European Pat. Off. .

*Primary Examiner*—Maura K. Regan
*Attorney, Agent, or Firm*—Bernard Franzblau

[57] ABSTRACT

A circuit for testing the leakage resistance of a circuit point. Particularly in the case of circuits where safety is important, a circuit point, particularly an output terminal of an integrated circuit, should be tested for a leakage resistance relative to ground and/or a voltage to provide an early detection of an imminent failure condition. To this end, at least one test current is fed into the circuit point and the voltage at the circuit point is monitored by means of a comparator. When the leakage resistance decreases below a permissible value the voltage at the circuit point decreases, which can be detected by the comparator. For monitoring a leakage resistance relative to both poles two opposite test currents are applied and the comparator is constructed as a window comparator.

22 Claims, 2 Drawing Sheets

5,640,095

CIRCUIT ARRANGEMENT FOR LEAKAGE-RESISTANCE TESTING OF A CIRCUIT POINT

BACKGROUND OF THE INVENTION

This invention relates to a circuit arrangement for testing a circuit point, which in a non-disturbed condition floats freely between a first and a second pole of an operating voltage in a given mode of operation. The circuit point is tested for a disturbed condition in which there is a leakage resistance relative to at least one pole of the operating voltage. The circuit arrangement includes at least one test circuit comprising a current source coupled to the circuit point to apply at least a given test current to this point, and having an evaluation circuit comprising at least one comparator having one input coupled to the circuit point to supply a first output signal when a current flows through the leakage resistance.

Such a circuit arrangement is known from EP 0,486,114 A2 which is hereby incorporated by reference. The current source in the test circuit is constructed as a current mirror which is connected to one pole of a high voltage source and which converts a current, which flows through the series arrangement of an object under test and two resistors and whose value is determined by the values of these resistors and the voltage of the voltage source, into an output current, which flows through a series arrangement of two further resistors. If a leakage current flows to one pole of the voltage source via the object under test, different currents will flow in the two resistor branches, which currents produce a corresponding difference voltage between the nodes of the series-connected resistors, which difference voltage is measured by means of one or more comparators. Thus, in this known circuit a current is applied to the object under test, which current is substantially larger than the maximum leakage current flowing through the leakage resistance to be monitored and which is determined by resistors disposed between the circuit point to be tested and one pole of the operating voltage, the part of the current mirror which supplies a current feeding a branch which is not connected to the object under test.

The circuit point to be tested is often situated within an extensive circuit, particularly an integrated circuit, or it forms an external output of such a circuit. Moreover, leakage-resistance testing should be effected not only on a single occasion, for example, during fabrication, but a continually repeated testing should be possible in normal operation. It is then not permissible to apply to the circuit point to be tested a current which is substantially larger than a current through an admissible leakage resistance, but the impedance at the circuit point should be as high as possible under all operating conditions, i.e. both test and normal operation.

SUMMARY OF THE INVENTION

It is an object of the invention to provide a circuit of the type defined in the opening paragraph, which circuit is included in a circuit arrangement, operates with a lower voltage than that which is required for the test circuit of EP 0 486 114, and is capable of rapidly supplying information about an excessive leakage current at a high-impedance circuit point.

According to the invention this object is achieved in that the current source includes a first current source to apply a first test current to the circuit point, which first test current has a first direction relative to the first pole and a value corresponding to a given tolerance value of the leakage resistance, said first test current flowing only when the voltage between the circuit point and the first pole becomes smaller than a given first limit value, and in that the comparator is connected to the circuit point for comparing the voltage at this circuit point with a given first reference voltage smaller than the first limit value and for supplying the first output signal when the voltage between the circuit point and the one pole of the operating voltage becomes smaller than the first reference voltage.

Such a current source can be, for example, a transistor which is saturated at the first limit value or which is connected to a clamping circuit which becomes operative at the first limit value. As long as the leakage resistance is adequate the voltage at the circuit point has substantially the first limit value. The voltage does not change until the leakage resistance falls below the tolerance value (i.e. admissible value of the leakage resistance) and the current through the leakage resistance consequently exceeds the first test current, which change is detected by the comparator. As a result, the first reference voltage can be substantially smaller than the first limit value.

Often it is not only important to monitor a leakage resistance relative to one pole of the operating voltage but the circuit point should also be monitored as regards a leakage resistance relative to each of the two poles of the operating voltage. In an embodiment of the invention such a circuit is characterized in that the current source includes a second current source to apply a second test current to the circuit point, which second test current has a second direction, opposite to the first direction, relative to the second pole and a value which also corresponds to the given tolerance value, said second test current flowing only when the voltage between the circuit point and the other pole becomes smaller than a given second limit value, the two limit values bounding a voltage range in which both test currents flow, and in that the comparator is a window comparator for comparing the voltage at the circuit point with a first and a second reference voltage which are situated outside the voltage range, and for supplying at least one signal when the voltage at the circuit point is outside the voltage range bounded by the reference voltages.

This requires not only the use of two current sources with oppositely directed test currents but also steps to ensure that the voltage ranges in which the current sources supply the test currents overlap one another. Since the comparator should then monitor a deviation to either side of the overlapping range this comparator should be a window comparator.

The two current sources can be independent of one another. However, since the test currents from these two current sources should be substantially equal to one another, it is effective, in accordance with a further embodiment of the invention, that the two current sources are coupled to one another via at least a first current mirror which, for generating the second test current, receives a control current from a second current mirror, which derives the control current and the first test current from a reference current. By varying the reference current it is achieved that both test currents vary similarly and remain substantially equal in magnitude.

In a further embodiment of the invention a favourable method of generating the reference current is obtained in that the reference current is adjustable by means of an external resistor connected between a terminal of the test circuit and the one pole, which terminal is substantially at a given fraction of the operating voltage. In this way it is easy to preset the value of the test current outside the integrated circuit. If, in accordance with a further embodiment of the invention, each reference voltage is determined by a voltage divider arranged between the poles of the operating voltage, the comparator will supply the first output signal regardless of the magnitude of the operating voltage when the ratio between the leakage resistance and the reference resistor exceeds a value which depends on this voltage divider.

A suitable construction of the window comparator is obtained in a further embodiment of the invention, which is characterised in that the window comparator comprises two separate comparators, which each compare the voltage at the circuit point with a different one of the two reference voltages. The two comparators then individually generate output signals depending on which reference voltage is passed and the two output signals can be evaluated individually or logically combined, as required.

A comparator which compares two voltages with one another has two inputs and one output and is often constructed as a differential amplifier. In order to ensure that such a comparator supplies an unambiguous and stable logic signal, it is effective in accordance with a further embodiment of the invention that one input of each comparator is coupled to a current generator, which is disconnectible by the signal at the output of this comparator, and to a resistor whose other end is connected to the circuit point and to the corresponding reference voltage, respectively, the current supplied by the current generator being derived from the reference current. The use of a current generator whose current depends on the reference current and hence on the external resistor produces hysteresis, as a result of which the value of the leakage resistance at which each comparator supplies the first output signal depends on the value of the external resistor and of the resistor used for the hysteresis and on the voltage divider ratio, but is independent of the operating voltage.

The voltage range which is bounded by the two limit values of the voltages at which the two current sources supply a current can be selected substantially freely between the potentials of the two poles of the operating voltage. However, in order to monitor leakage resistances of substantially equal magnitude with respect to both poles of the operating voltage, in accordance with a further embodiment of the invention, the voltage range is substantially centered between the potentials of the poles of the operating voltage. This can be achieved by an appropriate choice of the voltages at which the test currents of the two current sources are clamped.

If a circuit point is continually tested for leakage current, this also leads to continual consumption of power which, even though it is small, is not always desirable. On the other hand, such circuit points to be tested do not always have a high impedance connection but in many operating conditions also have a low-impedance connection with, in particular, one pole of the operating voltage. A further embodiment of the invention, which is very effective in such cases, is therefore characterised in that there are provided means for turning off the current sources. Such means may, for example, turn off the drive of the current sources or reduce a current used for the generation of the test currents to zero.

BRIEF DESCRIPTION OF THE DRAWINGS

Exemplary embodiments of the invention will be described in more detail hereinafter with reference to the drawings. In the drawings.

DESCRIPTION OF THE PREFERRED EMBODIMENTS

Figure 5:
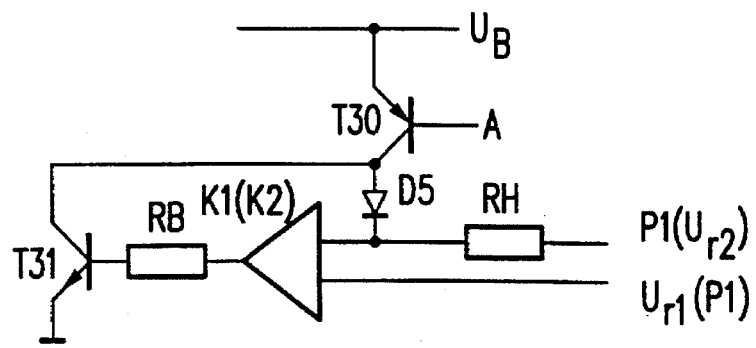

FIG. 5 is a circuit diagram relating to the generation of a hysteresis.

Figure 1:
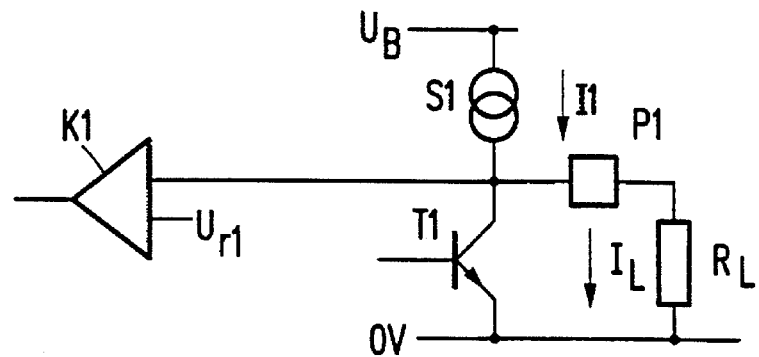
FIG. 1 is a circuit diagram to explain the principle of the invention.

In FIG. 1 a circuit point P1 representing an external connection of an integrated circuit is internally connected to the one pole 0V of an operating voltage via a transistor T1. The drive of the transistor T1 and other elements of the integrated circuit are not shown for the sake of simplicity. When the transistor T1 is cut off the circuit point P1 floats freely between the pole $U_B$ and the pole 0V of the operating voltage if there is no leakage resistance $R_L$ below a given tolerance value. In FIG. 1 the leakage resistance is shown as external to the integrated circuit, but it may alternatively or additionally be present in the integrated circuit.

In order to detect a leakage current $I_L$ through such a leakage resistance, a current source S1 is arranged between $U_B$ and the circuit point P1 and which supplies a test current IL. In practice, the current sources always have a saturation voltage below which the current source no longer supplies any current. Consequently, if in the circuit shown in FIG. 1 no leakage current flows, or only a leakage current $I_L$ smaller than the test current I1, the voltage at the circuit point P1 will rise towards $U_B$ until, across the current source S1, a residual voltage will be left below which the current source S1 supplies no test current, or no longer supplies the full test current. The test current I1 from the current source S1 can only be drained completely if the leakage resistance $R_L$ is smaller than a given tolerance value, and the circuit point P1 assumes a lower voltage.

The circuit point P1 is connected to an input of a comparator K1, whose other input receives a reference voltage $U_{r1}$, which is generated, for example, by means of a voltage divider, not shown, coupled between $U_B$ and 0V. The reference voltage is substantially equal to half the operating voltage. As long as the leakage resistance $R_L$ is high enough and, as consequence, the leakage current $I_L$ is small enough, the voltage at the circuit point P1 will lie above the reference voltage $U_{r1}$ and the comparator K1 will supply a low output signal. As soon as the leakage resistance falls below the tolerance value and the leakage current $I_L$ consequently exceeds the value of the test current I1, the voltage at the circuit point P1 will decrease below the reference voltage $U_{r1}$ and the comparator K1 will produce a high output signal, which indicates that the leakage resistance is too low.

Figure 2:
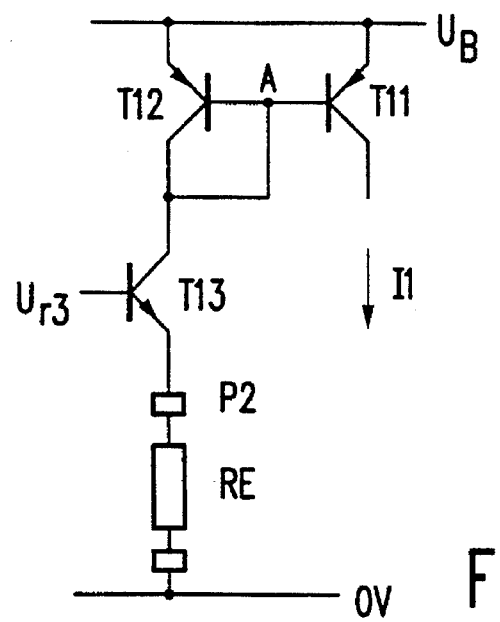
FIG. 2 shows an example of a current source.

FIG. 2 shows a practical example of the current source S1. In the present example the current source is formed by the pnp transistor T11 which has its emitter connected to $U_B$ and its base to a circuit node A. This node is driven by a pnp transistor T12, whose base is connected to its collector, so that the transistors T11 and T12 form a current mirror. As a result, a reference current derived from the collector of the transistor T12 is reflected to the collector of the transistor T11, where it generates a current I1, which is equal to the reference current if the transistors T11 and T12 have the same geometries.

The reference current is generated by an npn transistor T13 whose base receives a reference voltage $U_{r3}$ arid whose emitter is connected to a further circuit point P2, which is connected to 0V via an external resistor $R_E$. For a given reference voltage $U_{r3}$ the value of the external resistor $R_E$ determines the reference current and hence the tolerance value of the leakage resistance $R_L$, below which the comparator K1 responds.

Figure 3A:
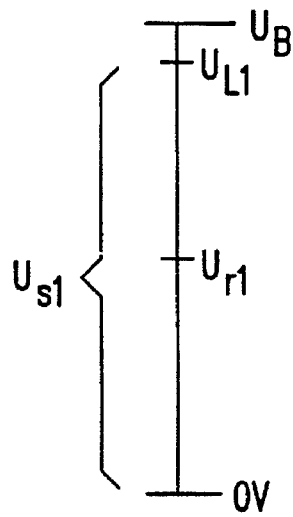
FIGS. 3a and 3b show two diagrams to explain the various voltages in the circuit.

The collector current I1 of the transistor T11 can flow only as long as the transistor T11 is not saturated, i.e. as long as the voltage between its emitter and collector exceeds a minimum value. This is illustrated by means of the diagram in FIG. 3a. The voltage $U_{L1}$, which is slightly below $U_B$, represents the saturation voltage of the transistor T11. Thus, the collector current or the test current I1 can flow only in the voltage range $U_{s1}$ between the limit value $U_{L1}$ of the collector voltage and 0V. The reference voltage $U_{r1}$ of the comparator lies within the voltage range $U_{s1}$. This clearly illustrates that when the leakage current is small enough the voltage at the circuit point P1 lies above $U_{r1}$, i.e. at $U_{L1}$, and when the leakage current exceeds the test current the voltage at the circuit point P1 decreases and thus falls below the reference voltage $U_{r1}$.

Figure 3B:
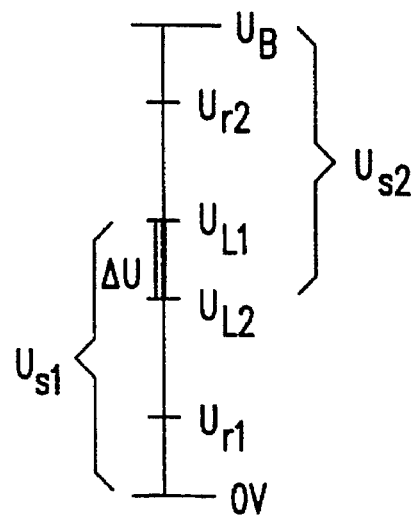

Until now the description relates to the detection of a leakage resistance relative to only one pole of the operating voltage, i.e. relative to 0V. In order to detect a leakage resistance relative to each of the two poles it is necessary not only to generate test currents in both directions but also to select the individual voltage values in an appropriate manner. As shown in FIG. 3B, the limit value $U_{L1}$ is then substantially centred between the two voltages $U_B$ and 0V. Consequently, the test current I1 can flow as long as the circuit point P1 has a value within the voltage range $U_{s1}$. For a second test current of opposite direction the situation is mirror-inverted, i.e. this test current can flow only when the circuit point has a value between a second limit value $U_{L2}$ and $U_B$, i.e. within the voltage range $U_{s2}$. The two limit values $U_{L1}$ and $U_{L2}$ are selected so as to obtain a voltage range $\Delta U$ in which both test currents can flow concurrently.

In principle, these two test currents can be generated with the same strength, but in practice an exact identity is not attainable. If it is now assumed that the test current I1 is larger than a test current I2 and the leakage resistance is assumed to be infinite, a voltage equal to $U_{L1}$ as described above will appear at the circuit point P1. Likewise, if the test current I1 is smaller than a test current I2 in the opposite direction a voltage $U_{L2}$ will appear at the circuit point P1. Thus, in each case the voltage at the circuit point P1 will lie within the voltage range $\Delta U$ as long as the leakage current is substantially zero.

The comparator should now also be symmetrical and it should compare the voltage at the circuit point P1 with two reference voltages $U_{r1}$ and $U_{r2}$, which lie outside the voltage range $\Delta U$. When the test current I1 is again assumed to be larger than a test current I2 in the opposite direction and now a leakage current flows as a result of a leakage resistance relative to 0V, this current will be added to the second test current in the circuit point P1, as will be apparent from a comparison with FIG. 1, and if the sum of the currents exceeds the test current I1 the voltage at the circuit point P1 decreases to the limit value $U_{L2}$ but not any further, because the second test current then ceases to flow. The voltage at the circuit point P1 does not decrease below the reference voltage $U_{r1}$ in FIG. 3b until the leakage resistance has become so low that the leakage current is larger than the first test current. A similar reasoning applies to the other current direction, i.e. the voltage at the circuit point P1 will increase beyond the second reference voltage $U_{r2}$ only in the case of a leakage current, as a result of a leakage resistance, with respect to $U_B$ which is larger than the second test current. The test currents can be limited at the limit values $U_{L1}$ and $U_{L2}$, for example, in that the relevant current sources are clamped at these voltages.

Figure 4:
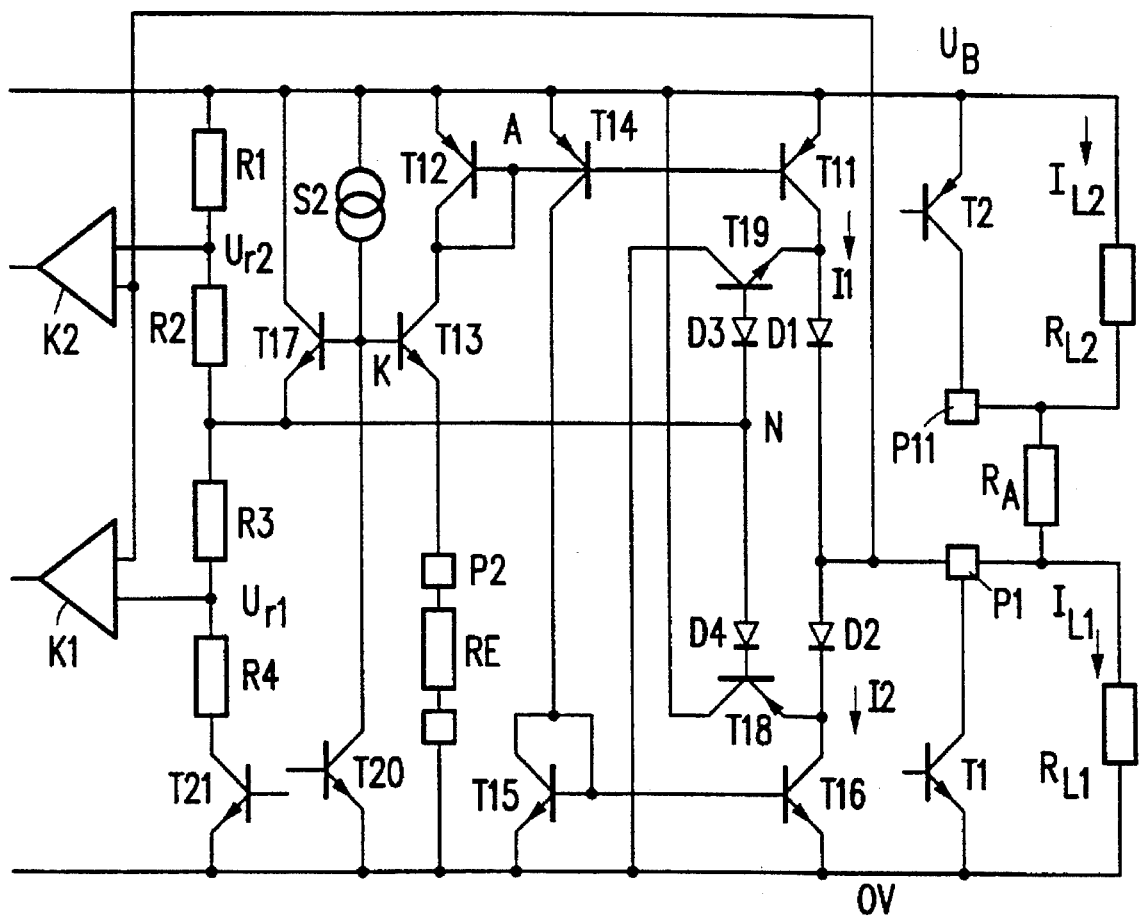
FIG. 4 is a diagram of a circuit for testing a circuit point for leakage currents in both directions.

FIG. 4 shows a complete circuit with such current sources for two test currents in mutually opposite directions, elements corresponding to those in FIG. 2 bearing the same reference symbols. The first test current I1 is again generated by a pnp transistor T11, which via the circuit node A forms a current mirror with the pnp transistor T12. Another pnp transistor T14 generates a collector current, which is equal to the first test current I1 in the case of identical geometries of the transistors T11 and T14.

The collector current of the transistor T14 is applied as a control current to a further current mirror comprising the npn transistors T15 and T16, and if these two transistors again have identical geometries the second test current I2 generated by the transistor T16 will be substantially equal in magnitude to the first control current I1, but will be directed oppositely relative to the circuit point P1.

The collector of the transistor T11, which supplies the first test current I1, is connected to the emitter of a pnp transistor T19, whose collector is connected to 0V and whose base is coupled to a circuit node N via a diode D3. This circuit node N is connected to $U_B$ via a voltage divider comprising the resistors R1 to R4 and to 0V via a transistor T21. The resistors R1 and R4 have equal values and the resistors R2 and R3 also have equal values, so that the circuit node N is at the voltage $0.5U_B$, assuming that the transistor T21 is conductive. As a result, the collector of the transistor T11 cannot become more positive than $0.5U_B+2U_D$, $U_D$ being the forward voltage of the diode D3 or the emitter-base voltage of the transistor T19. The upper limit value is then $U_{L1}=0.5U_B+U_D$ as a result of the diode D1, which is arranged between the collector of the transistor T11 and the circuit point P1. The diode D1 serves to prevent a current from flowing in particular from the circuit point P1 into the emitter of the transistor T19 if the voltage at this circuit point P1 becomes positive, particularly owing to a leakage current.

The same applies to the test current I2 generated by the transistor T16. The collector of this transistor is connected to the emitter of an npn transistor T18, whose collector is connected to $U_B$ and whose base is coupled to the circuit node N by a diode D4. Likewise, a diode D2 is arranged between the collector of the transistor T16 and the circuit point P1, so that the test current I2 can at the most produce the limit value $U_{L2}=0.5_{UB}-U_D$ at the circuit point P1. Depending on which of the two test currents I1 and I2 is larger and in which direction small leakage current possibly flows relative to the circuit point P1, this circuit point is either at the upper limit value $U_{L1}$ or at the lower limit value $U_{L2}$, as is indicated in FIG. 3b.

In the circuit shown in FIG. 4 the circuit point P1 is connected to 0V via the transistor T1 which is assumed to be cut off and to a load resistor $R_A$, whose other end is connected to a circuit point P11, which is connected to $U_B$ via a pnp transistor T2. The last mentioned transistor is also cut off in the normal operating condition. Since the load resistor $R_A$ has a very low value a leakage current $I_{L2}$, which flows, for example, from $U_B$ to the circuit point P11 via a leakage resistance $R_{L2}$, can also be monitored via the circuit point P1.

This monitoring is effected by means of a window comparator, which in the present example comprises two separate comparators K1 and K2. The two comparators K1 and K2 each have a first input connected to the circuit point P1. The reference voltage $U_{r1}$, which appears at the node between the voltage divider resistors R3 and R4, is applied to a second input of the comparator K1, and the reference voltage $U_{r2}$, which appears at the node between the voltage divider resistors R1 and R2, is applied to a second input of the comparator K2. When the resistors R1 to R4 are suitably dimensioned the two reference voltages $U_{r1}$ and $U_{r2}$ will be situated sufficiently far outside of the voltage range $\Delta U$, as is shown in FIG. 3B. If the leakage resistance $R_{L1}$ is small enough and carries a leakage current $I_{L1}$ exceeding the test current I1, the voltage at the circuit point P1 will become more negative than the reference voltage $U_{r1}$, as a result of which the comparator K1 supplies an output signal. The corresponding value of the leakage resistance $R_{L1}$ is then independent of the operating voltage, as will be demonstrated hereinafter.

The voltage at the circuit point N is referenced $U_N$ and complies with $$U_N = U_B \frac{R3 + R4}{R1 + R2 + R3 + R4}$$

The current $I_E$ through the resistor RE is then $$I_E = \frac{U_N}{RE} = \frac{U_B}{RE} \frac{R3 + R4}{R1 + R2 + R3 + R4}$$

The reference voltage $U_{r1}$ complies with $$U_{r1} = U_B \frac{R4}{R1 + R2 + R3 + R4}$$

It is assumed that the test current I1 through the current mirror is equal to the reference current $I_E$. The comparator K1 supplies an output signal when the voltages at both inputs are equal, i.e. when the voltage at the circuit point P1 is equal to the reference voltage $U_{r1}$, so that $$I_E R_{L1} < U_{r1}$$

$$\frac{U_B}{RE} \frac{R3 + R4}{R1 + R2 + R3 + R4} R_{L1} < U_B \frac{R4}{R1 + R2 + R3 + R4}$$

It follows that $$R_{L1} < RE \frac{R4}{R3 + R4}$$

This demonstrates that the value of the leakage resistance $R_{L1}$ below which the comparator K1 produces an output signal depends only on the external resistor $R_E$ and the voltage divider ratio but not on the operating voltage.

A similar relationship applies to the leakage resistance $R_{L2}$ relative to $U_B$. The comparator K2 supplies an output signal when the value of the leakage resistance $R_{L2}$ becomes smaller than a value $$R_{L2} < RE \frac{R1}{R3 + R4}$$

and the voltage at the circuit point P1 exceeds the reference voltage $U_{r2}$. The two output signals of the comparators may be processed separately or, if desired, they may be combined into a common output signal.

The test currents are determined by a reference current of the transistor T13, as explained by means of FIG. 2, and this current is determined by an external resistor $R_E$, which is connected to the circuit point P2, and by the voltage at the base of the transistor T13, which is connected to a circuit node K. This circuit node K is further connected to the base of an npn transistor T17, whose emitter is connected to the circuit node N. Moreover, the circuit node K receives a current from a current source S2. The connection between the transistors T17 and T13 ensures that the emitter of the transistor T13 and hence the circuit point P2 carries substantially the same voltage as the circuit node N, i.e. $0.5 U_B$.

In FIG. 4 the inputs of the comparators are simply shown to be connected directly to the circuit point P1 and to the reference voltages $U_{r1}$ and $U_{r2}$. However, in order to ensure that the comparators supply an unambiguous stable binary output signal they are in fact constructed so as to exhibit hysteresis. This is shown in detail in FIG. 5. Thus, one input of each of the comparators K1 and K2 is connected to the relevant circuit point via a resistor RH, i.e. to the circuit point P1 in the case of the comparator K1 and to the circuit point $U_{r2}$ in the case of the comparator K2. The other input of the comparator K1 is connected to the reference voltage $U_{r1}$ and the other input of the comparator K2 to the circuit point P1. The following description relates directly to the comparator K1 but also applies to the comparator K2.

The input of the comparator K1 which is connected to the resistor RH is connected to a current generator via a diode D5, which current generator comprises the collector of a pnp transistor T30, whose emitter is connected to $U_B$ and whose base is connected to the circuit point A in FIG. 4. As a result of this, the transistor T30 operates as a current generator supplying a current which depends on the reference current $I_E$ and which is a fixed fraction of this reference current, which is achieved in that the emitter area of the transistor T30 is selected to be correspondingly smaller than the emitter area of the transistor T12.

If the comparator K1 is to supply an output signal the following relationship is valid $$I_E R_L < U_{r1} + U_H$$

Here, the voltage $U_H$ is the voltage drop across the resistor RH $$U_H = I_E \times R_H$$

where x is the factor by which the emitter area of the transistor T30 is scaled down relative to the emitter area of the transistor T12, as a result of which the current is also correspondingly smaller. This yields $$R_L < \frac{U_{r1}}{R3 + R4} + x RH$$

$$R_L < RE \frac{R4}{R3 + R4} + x RH$$

This shows that the value of the leakage resistance at which the comparator supplies an output signal is now independent of the operating voltage.

As soon as the switching condition for the comparator is met and the output signal is generated, a transistor T31 is turned on via a resistor RB, which transistor drains the current from the current generator T30, so that there is no longer a voltage drop across the resistor RH. As a result of this, the comparator K1 is stabilised in its switched over state, even in the case of small voltage fluctuations at the circuit point P1.

The circuit arrangement for the comparator K2 is similar and operates in a similar manner, for which reason it is not described any further.

In general, leakage current testing need not be effected continuously. Instead, it is adequate to effect testing at regular intervals or at given instants. Therefore, the circuit shown in FIG. 4 is constructed in such a manner that the current sources for the test currents can be turned off. This is effected by means of the transistors T20 and T21. As long as the transistor T21 conducts and the transistor T20 is cut off the test currents are generated as described hereinbefore. However, when the transistor T21 is cut off and the transistor T20 is conductive the transistor T13 will also be cut of, as result of which no reference current flows and, consequently, all of the transistors T11 to T19 are also currentless.

We claim:

1. A circuit arrangement for testing a circuit point, which floats freely between a first and a second pole ($0V$, $U_B$) of an operating voltage in a given mode of operation in a non-disturbed condition, for a disturbed condition in which there is a leakage resistance relative to at least one pole of the operating voltage, wherein the circuit arrangement comprises at least one test circuit comprising a current source coupled to the circuit point, to apply at least a given test current to said circuit point, and an evaluation circuit comprising at least one comparator having one input coupled to the circuit point so as to supply a first output signal when a current flows through the leakage resistance, wherein the current source includes a first current source to apply a first test current (I1) to the circuit point which has a first direction relative to the first pole ($0V$) and a value corresponding to a given tolerance value of the leakage resistance, said first test current flowing only when a voltage between the circuit point and the first pole becomes smaller than a given first limit value ($U_{L1}$), and in that the comparator is connected to the circuit point for comparing the voltage ($U_A$) at the circuit point with a given first reference voltage ($U_{r1}$) smaller than the first limit value and for supplying the first output signal when the voltage between the circuit point and the one pole ($0V$) of the operating voltage becomes smaller than the first reference voltage ($U_{r1}$).

2. A circuit arrangement as claimed in claim 1, for testing the circuit point for a leakage resistance relative to each of the two poles of the operating voltage, wherein the current source includes a second current source to apply a second test current (I2) to the circuit point, which second test current has a second direction, opposite to the first direction, relative to the second pole ($U_B$) and a value which also corresponds to the given tolerance value, said second test current flowing only when the voltage between the circuit point and the other pole ($U_B$) becomes smaller than a given second limit value ($U_{L2}$), the two limit values bounding a voltage range ($\Delta U$) in which both test currents (I1, I2) flow, and in that the comparator is a window comparator for comparing the voltage ($U_A$) at the circuit point with a first and a second reference voltage ($U_{r1}$, $U_{r2}$) which are situated outside the voltage range ($\Delta U$), and for supplying at least one signal when the voltage ($U_A$) at the circuit point is outside the voltage range bounded by the reference voltages ($U_{r1}$, $U_{r2}$).

3. A circuit arrangement as claimed in claim 2, wherein the two current sources are coupled to one another via at least a first current mirror which, for generating the second test current (I2), receives a control current from a second current mirror, which derives the control current and the first test current (I1) from a reference current.

4. A circuit arrangement as claimed in claim 3, wherein the reference current is adjustable by means of an external resistor (RE) connected between a terminal (P2) of the test circuit and the one pole ($0V$), which terminal is substantially at a given fraction of the operating voltage.

5. A circuit arrangement as claimed in claim 2, wherein each reference voltage ($U_{r1}$, $U_{r2}$) is determined by a voltage divider connected between the poles ($U_b$, $0V$) of the operating voltage.

6. A circuit arrangement as claimed in claim 5 wherein the window comparator comprises two separate comparators each of which compare the voltage ($U_A$) at the circuit point with a different one of the two reference voltages ($U_{r1}$, $U_{r2}$).

7. A circuit arrangement as claimed in claim 6, each comparator having two inputs and one output, wherein one input of each comparator is coupled to a current generator which is disconnectible by a signal at the output of said comparator, and to a resistor (RH) whose other end is connected to the circuit point and to the corresponding reference voltage ($U_{r2}$), respectively, the current supplied by the current generator being derived from the reference current.

8. A circuit arrangement as claimed in claim 2 wherein the voltage range ($\Delta U$) is substantially centred between the potentials of the poles ($0V$, $U_B$) of the operating voltage.

9. A circuit arrangement as claimed in claim 2 further comprising means for turning off the current sources.

10. A circuit arrangement as claimed in claim 3, wherein each reference voltage ($U_{r1}$, $U_{r2}$) is determined by a voltage divider connected between the poles ($U_b$, $0V$) of the operating voltage.

11. A circuit arrangement as claimed in claim 2, wherein the window comparator comprises two separate comparators each of which compare the voltage ($U_A$) at the circuit point with a different one of the two reference voltages ($U_{r1}$, $U_{r2}$).

12. A circuit arrangement as claimed in claim 11, each comparator having two inputs and one output, wherein one input of each comparator is coupled to a current generator, which is disconnectible by a signal at the output of said comparator, and to a resistor (RH) whose other end is connected to the circuit point and to the corresponding reference voltage ($U_{r2}$), respectively, the current supplied by the current generator being derived from the reference current.

13. A circuit arrangement as claimed in claim 3, wherein the voltage range ($\Delta U$) is substantially centered between the potentials of the poles ($0V$, $U_B$) of the operating voltage.

14. A circuit arrangement as claimed in claim 11, further comprising means for turning off the current sources.

15. A circuit arrangement as claimed in claim 1, wherein the reference current is adjustable by means of an external resistor (RE) connected between a terminal of the test circuit and the one pole ($0V$), which terminal is substantially at a given fraction of the operating voltage.

16. A test circuit for testing a circuit point of an integrated circuit for leakage resistance relative to at least one pole of a source of operating voltage on the integrated circuit, wherein the circuit point floats between first and second poles of the operating voltage, the test circuit comprising:

a current source coupled to the circuit point so as to apply a given first test current to said circuit point and which flows in a first direction relative to the first pole of the operating voltage and has an amplitude determined by a given tolerance value of the leakage resistance, said first test current being able to flow only when a voltage between the circuit point and the first pole of the operating voltage is less than a given first voltage limit value, and a comparator having a first input coupled to the circuit point and a second input coupled to a first reference voltage which is smaller than the first voltage limit value thereby to supply at its output, when the voltage between the circuit point and the first pole is smaller than the first reference voltage, a first output signal indicating that the leakage resistance at the circuit point is below the given tolerance value.

17. The test circuit as claimed in claim 16 further comprising:

a second current source coupled to the circuit point so as to apply a given second test current to said circuit point which flows in a second direction opposite to the first direction relative to the circuit point and, relative to the second pole of the operating voltage, has an amplitude determined by said given tolerance value of the leakage resistance, said second test current being able to flow only when the voltage between the circuit point and the second pole of the operating voltage is less than a given second voltage limit value, said first and second voltage limit values defining a voltage range in which both the first and second test currents flow, and wherein the comparator comprises a window comparator which compares the voltage at the circuit point with the first reference voltage and with a second reference voltage each of which is outside of said voltage range thereby to supply at its output said first output signal when the voltage at the circuit point is outside said voltage range whereby the test circuit tests the circuit point for leakage resistance relative to each of the first and second poles of the operating voltage.

18. The test circuit as claimed in claim 17 wherein the first and second current sources are derived from a common current source coupled to said circuit point via respective first and second current mirror circuits.

19. The test circuit as claimed in claim 16 wherein said current source comprises a transistor coupled to one pole of the source of operating voltage and which is arranged to saturate at the first voltage limit value.

20. The test circuit as claimed in claim 16 wherein said current source comprises a current mirror coupled to a terminal of the test circuit, and wherein said first test current is determined by an external resistor connected between said terminal and the first pole of the source of operating voltage.

21. The test circuit as claimed in claim 16 wherein said current source comprises a transistor coupled between the second pole of the source of operating voltage and the circuit point and arranged so that its collector current supplies the first test current, said first test current being able to flow only so long as the transistor is not saturated.

22. The test circuit as claimed in claim 17 wherein said first and second test currents are substantially equal to one another.

* * * * *